(12) United States Patent
Pinter et al.

(10) Patent No.: US 6,360,605 B1
(45) Date of Patent: Mar. 26, 2002

(54) MICROMECHANICAL DEVICE

(75) Inventors: Stefan Pinter; Martin Schoefthaler, both of Reutlingen; Matthias Illing, Kusterdingen; Ralf Schellin, Reutlingen; Helmut Baumann, Gomaringen; Michael Fehrenbach, Mittelstadt; Dietrich Schubert, Reutlingen; Georg Bischopink, Pliezhausen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/608,094

(22) Filed: Jun. 30, 2000

(30) Foreign Application Priority Data

Jul. 3, 1999 (DE) .......................... 199 30 779

(51) Int. Cl.⁷ .............................................. G01P 15/00
(52) U.S. Cl. ................... 73/514.38; 73/514.32
(58) Field of Search .................... 73/514.38, 514.32

(56) References Cited

U.S. PATENT DOCUMENTS

| | | | | |
|---|---|---|---|---|
| 6,065,341 A | * | 5/2000 | Ishio et al. ............... | 73/514.32 |
| 6,105,428 A | * | 8/2000 | Schmiesing et al. ..... | 73/514.32 |
| 6,250,782 B1 | * | 6/2001 | Kato et al. ................ | 73/514.32 |
| 6,272,926 B1 | * | 8/2001 | Fehrenbach et al. ..... | 73/514.32 |
| 6,276,207 B1 | * | 8/2001 | Sakai et al. ............... | 73/514.16 |
| 6,282,960 B1 | * | 9/2001 | Samuels et al. .......... | 73/514.32 |

* cited by examiner

*Primary Examiner*—Richard A. Moller
(74) *Attorney, Agent, or Firm*—Kenyon & Kenyon

(57) ABSTRACT

A micromechanical device, in particular an acceleration sensor, includes a seismic mass which is resiliently supported on a substrate via a first flexural spring device and which can be deflected in at least one direction by an acceleration, the deflection being able to be limited by a stop device. The stop device has at least one limit stop that is resiliently supported on the substrate via a second flexural spring device, the second flexural spring device having a greater flexural strength than the first flexural spring device.

9 Claims, 4 Drawing Sheets

MICROMECHANICAL DEVICE

FIELD OF THE INVENTION

The present invention relates to a micromechanical device, in particular an acceleration sensor, having a seismic mass which is resiliently supported on a substrate via a first flexural spring device and which can be deflected in at least one direction by an acceleration, the deflection being able to be limited by a stop device.

BACKGROUND INFORMATION

Although applicable to any micromechanical devices and structures, in particular sensors and actuators, the present invention and its underlying problem are explained with regard to a micromechanical acceleration sensor which can be manufactured in the technology of silicon surface micromechanics.

Acceleration sensors, and particularly micromechanical acceleration sensors in the technology of surface micromechanics or bulk micromechanics are gaining larger and larger market segments in automotive equipment applications, increasingly replacing the piezoelectric acceleration sensors customary in known methods heretofore.

The known micromechanical acceleration sensors usually work in such a way that the resiliently supported seismic mass device, which can be deflected in at least one direction by an external acceleration, produces a change in capacitance of a differential capacitor device connected thereto in response to a deflection, the change in capacitance being a measure for the acceleration.

Known, in particular, are acceleration sensors in which the deflection of the seismic mass can be limited by a fixed limit stop which is accommodated, for example, in an opening of the seismic mass.

In the known acceleration sensors, it has turned out to be a disadvantage that, subsequent to overload accelerations, the seismic mass, as the central electrode, can adhere to such fixed limit stops due to adhesive forces and/or because of electrostatic forces resulting from charges since the restoring force of the springs is too low.

On the other hand, increasing the restoring force of the springs would negatively influence the measuring sensitivity.

SUMMARY OF THE INVENTION

The micromechanical device according to the present invention has the advantage that the resiliently supported mechanical limit stops effectively prevent the seismic mass from adhering to the limit stops.

The basic idea of the present invention lies in that the stop device has at least one limit stop which is resiliently supported on the substrate via a second flexural spring device. The second flexural spring device expediently has a greater flexural strength (stiffness) than the first flexural spring device, i.e., it is a "hard" spring.

According to a preferred embodiment, the stop device has at least one limit stop fixedly supported on the substrate. Thus, a combination of one resilient limit stop and one fixed limit stop is obtained.

According to a further preferred refinement, the limit stop which is resiliently supported on the substrate is joined to the limit stop which is fixedly supported on the substrate via the second flexural spring device. Because of this, no additional substrate anchoring is necessary for the resiliently supported limit stop.

According to another preferred embodiment, a stop device is provided in an opening of the seismic mass. This saves space and enables the stop device to be accommodated with protection.

According to a further preferred embodiment, the stop device is designed in such a manner that the resiliently supported limit stop enters into action in response to a first deflection magnitude, and the fixedly supported limit stop enters into action in response to a second deflection magnitude, the first deflection magnitude being smaller than the second deflection magnitude. Thus, the seismic mass is first decelerated prior to getting to the fixed limit stop where it is stopped abruptly. In this context, the prestress of the elastic limit stops should be dimensioned such that adhesion is prevented.

According to a further preferred refinement, the stop device has one or a plurality of projections which the stopping effect is concentrated on. This further reduces the risk of adhesion since the contact area is limited to few points.

According to another preferred embodiment, the clearance of the projections in the region of the resiliently supported limit stop(s) is smaller than in the region of the fixedly supported limit stop(s).

According to a further preferred embodiment, the stop device has a limit stop which is fixedly supported on the substrate in an opening in the seismic mass, the second flexural spring device extending from the limit stop into an opening of a movable electrode laterally attached thereto, the resiliently supported limit stop being provided essentially at the end of the second flexural spring device. This has the advantage that the second flexural spring device can be have a longer design, and that its flexural strength can therefore be adjusted more accurately.

DETAILED DESCRIPTION

In the Figures, identical or functionally identical components are designated by the same reference symbols.

To further illustrate the underlying problem of the present invention, first of all, the design of a known acceleration sensor is explained in greater detail with reference to FIGS. 4 through 6.

Figure 4:
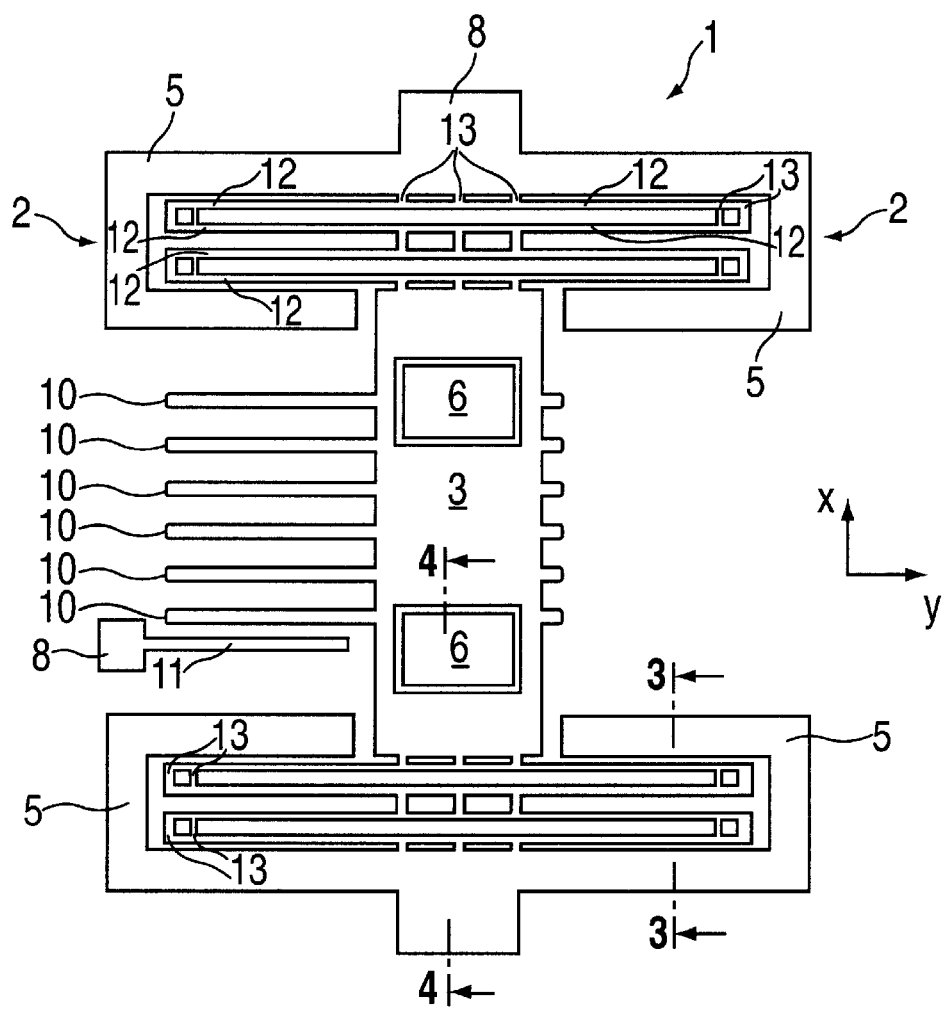
FIG. 4 shows a top view of a known acceleration sensor.
Figure 5:
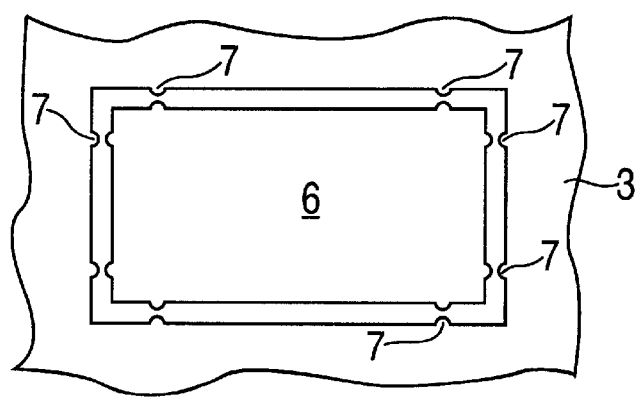
FIG. 5 shows mass limit stops of FIG. 4 in an enlarged representation.
Figure 6:
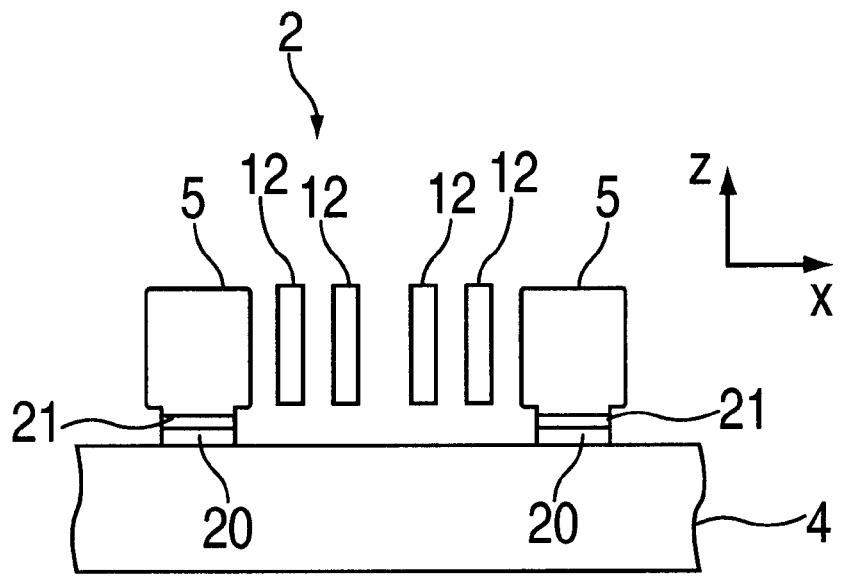
FIG. 6 shows a cross-section through the acceleration sensor according to FIG. 4 along line III—III.

FIG. 4 shows a top view of a known acceleration sensor, and FIGS. 5 and 6 show cross-sections through the acceleration sensor according to FIG. 4 along lines III and IV, respectively.

Acceleration sensor 1 shown in FIG. 4 is mounted on a substrate 4 which is not shown in FIG. 4 but represented in the cross-sections of FIGS. 5 and 6.

Acceleration sensor 1 has a spring-mass system which is formed of spring elements 2 and a seismic mass 3. As is discernible in FIG. 4, spring element 2 is composed of a plurality of partial spring elements 12. Seismic mass 3 is joined to a first of these spring elements 12 via a plurality of connecting bars 13. Spring elements 12 are joined by connecting bars 13 either at their outer ends or in their middle, respectively. Starting from seismic mass 3, a first spring element 12 is joined to seismic mass 3 by three connecting bars 13 in the middle of spring element 12. Via connecting bars 13 which are located in the outer region of the partial spring elements, this first spring element 12 is then joined to second spring element 12 which is then joined to a third spring element by three connecting bars in the middle. Third spring element 12 is then joined to a fourth spring element 12 by outer connecting bars 13, the fourth spring element being joined to a support 8 via connecting bars 13 in the middle.

Figure 7:
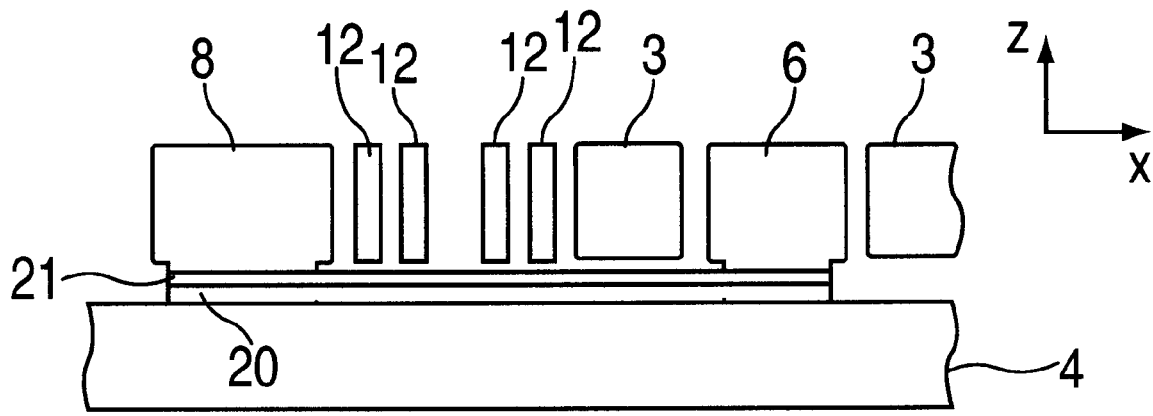
FIG. 7 shows a cross-section through the acceleration sensor according to FIG. 4 along line IV—IV.

A support 8 is fixedly joined to substrate 4, as is discernible, for example, in FIG. 7.

FIG. 7 shows a cross-section through support 8, which is fixedly joined to substrate 4 by layers 21 and 20. The exact function of layers 21 and 20 will be explained later.

Moreover, FIG. 7 shows a cross-section through partial spring elements 12 and through parts of seismic mass 3. As is clearly discernible in FIG. 7, partial spring elements 12 and seismic mass 3 are not directly mechanically joined to substrate 4 but have a distance from substrate 4. Partial spring elements 12 and seismic mass 3 are joined mechanically to substrate 4 exclusively via support 8. This is, in fact, why these parts can be displaced relative to the substrate by acting accelerative forces. In this context, the sensitivity to accelerative forces is adjusted by rating the stiffness of the spring elements correspondingly.

As is discernible in the top view of FIG. 4, seismic mass 3 is secured to supports 8 by spring elements 2 at two sides. In this context, spring elements 2 have partial spring elements 12, which are very long in the y-direction and which consequently have a low stiffness in the x-direction. In this manner, it is guaranteed that spring elements 12 and seismic mass 3, respectively, are deflected in response to small accelerations in the x-direction. Affixed to seismic mass 3 are a plurality of movable electrodes 10 which are aligned, for example, orthogonally to the x-direction, as shown in FIG. 4. Parallel to these movable electrodes 10, provision is made for stationary electrodes 11 which each are fixedly joined to substrate 4 by a support 8. For reasons of simplification, only one of these stationary electrodes 11 with an appertaining support 8 is shown in FIG. 4. Moreover, only a few movable electrodes 10 are depicted in FIG. 4, the movable electrodes being represented completely only for the left side of seismic mass 3. This is carried out for reasons of simplification, as well.

Movable electrodes 10 and stationary electrodes 11 are electrically isolated from one another and thus form plate-type capacitors whose capacitance changes as a function of the acceleration acting in the x-direction. Thus, the acceleration can be measured by measuring the capacitance.

Because of the long measure of partial spring elements 12 in the y-direction, spring elements 2 have a very low stiffness in the x-direction. Furthermore, the stiffness in the z-direction, i.e., orthogonally to substrate 4, is only small, as well. Since an acceleration sensor which is designed, for example, for a measuring range up to the single gravitational acceleration of the earth must also tolerate very large shock accelerations, provision is made for a plurality of limit stops.

As is discernible in FIG. 4, mass limit stops 6 which limit the deflections of seismic mass 3 parallel to substrate 4 in the x-direction and in the y-direction are provided within seismic mass 3. Furthermore, spring elements 2 are surrounded by spring limit stops 5, which, originating at supports 8, extend around partial spring elements 12 from all sides.

FIG. 5 shows mass limit stops 6 of FIG. 4 in an enlarged representation. Mass limit stops 6 are structures which are fixedly joined to substrate 4, as is shown, for example, in FIG. 7 in a cross-sectional view. As is discernible in FIG. 5, mass limit stops 6 are completely surrounded by seismic mass 3 so that the motions of seismic mass 3 are limited by mass limit stops 6 in all directions parallel to substrate 4, i.e., in the x-direction and in the y-direction.

Both in seismic mass 3 and in mass limit stops 6, provision is made for projections 7 which guarantee that seismic mass 3 and mass limit stops 6 come into contact with each other only at individual points, namely at projections 7 only. In this context, the clearance of the projections, in particular in the x-direction, is selected in such a manner that it is maximally ½ to ¾ of the distance between movable electrodes 10 and stationary electrodes 11.

The method of functioning and of action of spring limit stops 5 is now explained in greater detail by way of FIG. 6. FIG. 6 shows a cross-section through the sensor according to FIG. 4 along line III—III. Compared to partial spring elements 12, from a mechanical standpoint, spring limit stops 5 are comparably stable structures as is discernible in FIG. 6, the structures being fixedly joined to substrate 4 via joining layers 21 and 20. Consequently, spring limit stops 5 are fixedly joined to substrate 4, and, from its mechanical design, are such that can take up larger forces without significant deformation. As is also discernible in the cross-section of FIG. 6, partial spring elements 12 have a relatively narrow design in the x-direction. Consequently, partial spring elements 12 are heavily deformed in response to a large acceleration in the x-direction and laterally pressed against one of spring limit stops 5 in response to correspondingly large accelerative forces. However, partial spring elements 12 are prevented from further deformation since its further motion is limited by mechanically rigid spring limit stops 5. Therefore, the spring limit stops protect partial spring elements 12 from excessive deformations and from rupture or plastic deformations. By designing spring limit stops 5 in the same height as partial spring elements 12, it is guaranteed for spring limit stops 5 to be actually able to perform this function while acceleration components exists in the z-direction and in the x-direction concurrently.

The components of acceleration sensor 1 such as supports 8, spring elements 2, seismic mass 3, movable electrodes 10, and stationary electrodes 11 are formed of a conductive material. In this manner, it is made possible for the sensor signal to be measured by contacting supports 8, i.e., both supports 8 of stationary electrodes 11 and supports 8 which spring elements 2 are affixed to. Besides metal, silicon is then usable as conductive material since silicon can be processed using well-known methods from the semiconductor production. For sensors of that kind, one usually takes a substrate 4 of silicon as well, since a substrate of that kind is adapted well to the silicon of the sensor in terms of the thermal expansion coefficient. On condition that the sensors are composed of silicon, and that substrate 4 is composed of silicon, as well, a two-layer design for the joining layers between the sensor and substrate 4 is shown in FIG. 6. Lower layer 20 is composed of an insulating material such as silicon dioxide, silicon nitride, a glass or a mixed material of the materials mentioned above. For second layer 21, here, a conducting layer, in particular of highly doped polysilicon is provided. This layer guarantees that spring limit stops 5 are at the same potential as support 8 and also partial spring elements 12. Furthermore, these layers have proven to be excellent mechanical attachment layers.

In FIG. 7, a cross-section along line IV of FIG. 4 is depicted. FIG. 7 shows a cross-section through a support 8, through four partial spring elements 12, a region of seismic mass 3, and through a mass limit stop 6. Insulating layer 20 and conducting layer 21, originating at support 8, extend underneath partial spring elements 12 and seismic mass 3 to mass limit stop 6. Thus, mass limit stop 6 is mechanically joined, in a fixed manner, to substrate 4. By continuous joining layer 21, which is formed in the form of a conducting layer, an electrical contact is made between support 8 and mass limit stop 6. Thus, it is guaranteed that mass limit stop 6 is at the same potential as seismic mass 3 surrounding it, and electrostatic attractive forces between mass limit stop 6 and seismic mass 3 are thus prevented.

In FIG. 7, conducting layer 21, moreover, forms a limit stop for the seismic mass under partial spring elements 12 in the z-direction, the motion of seismic mass 3 or spring elements 2 in a direction toward substrate 4 being limited by the limit stop. In this context, it is important that conducting layer 21 and insulating layer 20 cover only part of the surface of substrate 4 so that the contact area between seismic mass 3 and layer 21 is small. In this manner, it is guaranteed that, because of the small contact area, no significant adhesive forces can appear. Since conducting layer 21 is at the same potential as support 8, no electrostatic attractive forces between this conducting layer 21 and seismic mass 3 are generated either. Consequently, layer 21, together with layer 20, forms a limit stop by which a direct contact of seismic mass 3 with substrate 4 is prevented. In this context, it is guaranteed by insulating layer 20 that no electrical short circuit is produced between seismic mass 3 and substrate 4.

In FIG. 7, conducting layer 21 and insulating layer 20 are represented in the form of a printed circuit trace which interconnects support 8 and mass limit stop 6. Conducting layer 21 and insulating layer 20 can also be arranged underneath other regions of seismic mass 3 just as well provided that the total area is markedly smaller than the area of seismic mass 3, and that an electrical contact to support 8 is maintained.

The spring elements shown in FIG. 4, which each are composed of a plurality of partial spring elements 12, are interconnected by a plurality of connecting bars 13, respectively. By using multiple connecting bars 13, a high fracture strength of these connections of the individual partial spring elements is guaranteed.

Now, a specific embodiment of the present invention is explained in greater detail with reference to FIGS. 1 and 2. In this context, FIG. 1 shows a top view of the acceleration sensor according to a specific embodiment of the present invention, and FIG. 2 shows a cross-section through the acceleration sensor according to FIG. 1 along line A–A'.

Figure 1:
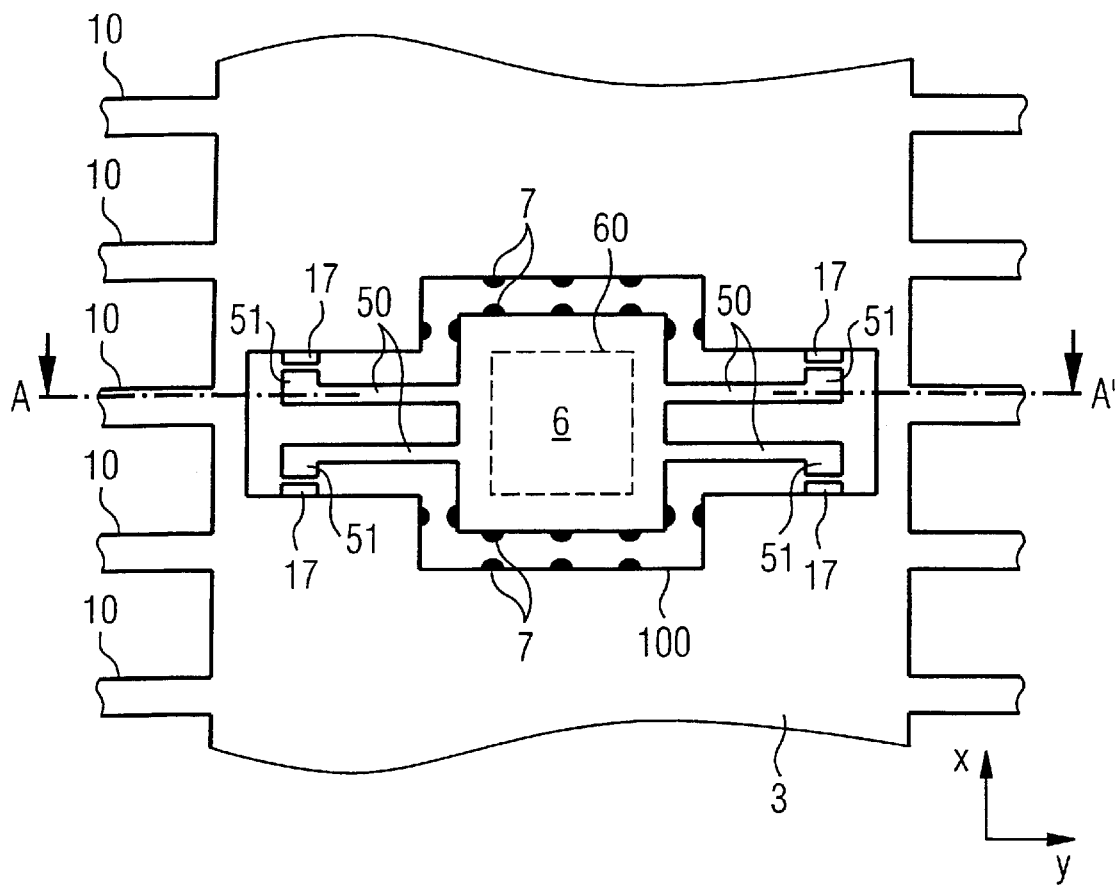
FIG. 1 shows a top view of an acceleration sensor according to a specific embodiment of the present invention.
Figure 2:
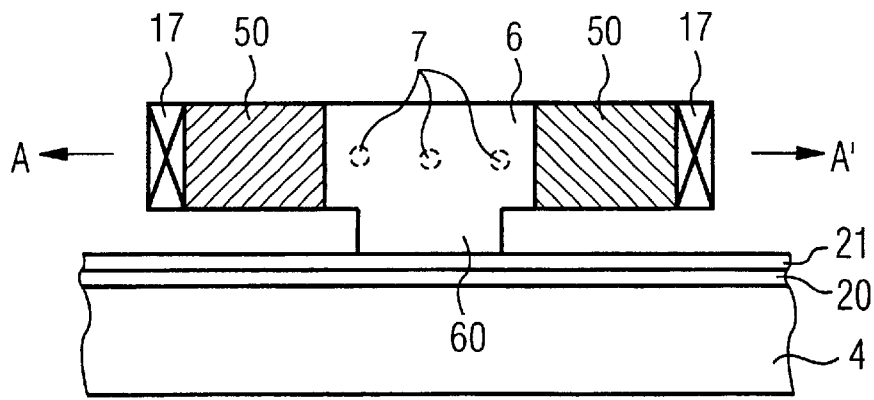
FIG. 2 shows a cross-section through the acceleration sensor according to FIG. 1 along line A–A'.

In FIGS. 1 and 2, in addition to the reference symbols already introduced, 17 designates projections, 50 designates spring elements of the second flexural spring device, 51 a limit stop in the form of an enlarged end of spring elements 50, 60 an anchoring region of mass limit stop 6, and 100 an opening of seismic mass 3.

In the specific embodiment according to FIG. 1, opening 100 is provided in seismic mass 3; the opening accommodating both known fixed limit stop 6 and four resiliently supported limit stops 51. Resiliently supported limit stops 51 are formed in one piece with fixed limit stop 6, namely in the form of flexural springs 50 which originate at the fixed limit stop and which extend in pairs to the left and to the right, respectively. In this context, the actual limit stop is a projection and an enlargement, respectively, at the end of respective flexural spring 50. In this context, the flexural strength of flexural springs 50 exceeds, by orders of magnitude, namely expediently by a factor 1 to 1000, the overall effective flexural strength of all partial spring elements 12 of first flexural spring device by which the seismic mass is resiliently suspended above substrate 4.

The present arrangement of resiliently supported limit stops 51 is advantageous in so far as it allows overload accelerations having different signs to be intercepted on both sides. Projections 7 at seismic mass 3 and fixed limit stop 6, respectively, correspond to those known from FIGS. 3 and 4. Additional projections 17, which are located opposite of the enlargements at the ends of flexural springs 50, are dimensioned such that the clearance in the region of the resiliently supported limit stops is smaller than the clearance in the region of projections 7 of fixed limit stops 6. In this exemplary embodiment, the ratio of the clearance of the resiliently supported limit stops to the clearance of the fixed limit stops is 0.6 or 0.8. Within the bounds of the technical constraints, all values smaller than 1 are always possible.

When, during the operation of an acceleration sensor designed in such a manner, an excessive acceleration occurs in the direction of the x-axis, seismic mass is deflected "upward" 3 according to FIG. 1. In the process, starting from a first deflection magnitude, first, the two lower projections 17 touch resiliently supported limit stops 51. Thereupon, the two lower flexural springs 50 are deflected upward, and build up a corresponding restoring force. In response to further deflection, a deflection magnitude is reached where projections 7 of seismic mass 3 and of fixed limit stop 6 touch one another. At this point, the motion in the x-direction is stopped definitively, and the restoring force accumulated in flexural springs 50 reaches its highest value. This value of the restoring force is higher than the value of the restoring force of the first flexural spring device, corresponding to the greater flexural strength than that of the first flexural spring device. This restoring force is dimensioned such that projections 7 are prevented from adhering to one another. When the acceleration in the x-direction decreases, then the seismic mass is accelerated in the negative x-direction under the action of flexural springs 50 as a result of which, first of all, the contact of projections 7 ceases to exists. In the further course of the motion, seismic mass 3 is further accelerated in the negative x-direction, and finally, the contact between projections 17 and limit stops 51 is released, as well.

This specific embodiment enables potential-free mechanical limit stops 51 resiliently supported in the detecting direction of the acceleration sensor, the limit stops being able to effectively prevent the seismic mass from adhering to the limit stops.

With respect to the manufacturing process, it should be mentioned that the limit stops are implemented in the plane of the chip or in the detecting direction by leaving seismic mass 3 open in the predefined regions and attaching epitaxially reinforced silicon on the buried polycrystalline silicon via windows in a sacrificial oxide layer. This epitaxially reinforced silicon contains the projections or limit stop humps which complement the corresponding projections at the seismic mass. As mentioned before, the clearance of the projections is expediently smaller than the clearance of the electrodes or of the flexural bar elements. Typically, the clearance lies at ½ to ¾ of the electrode distance.

Figure 3:
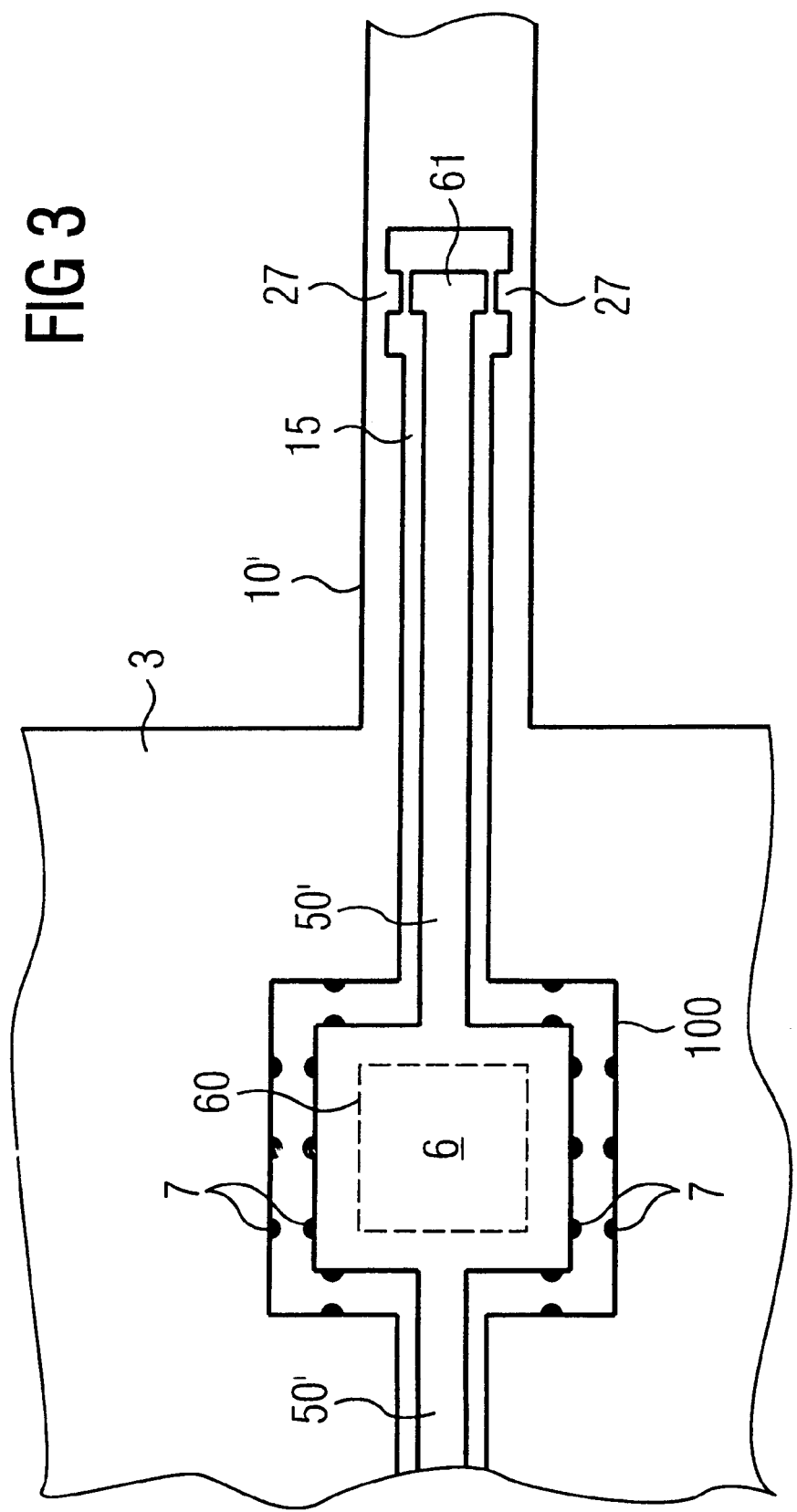
FIG. 3 shows a top view of an acceleration sensor according to a further specific embodiment of the present invention.

FIG. 3 shows a top view of an acceleration sensor according to a further specific embodiment of the present invention.

In this specific embodiment, the resilient action of the second flexural spring device, which is designated by 50' here, is supported in that limit stop 61 which is located at the end of the second flexural spring device is moved further away from the center line of seismic mass 3, i.e., enlarged transversely to the detecting direction in the area of movable electrodes 10'.

As in the first specific embodiment, the stop device features the limit stop 6 fixedly supported on substrate 4 in an opening 100 in seismic mass 3.

Originating at this limit stop 6, second flexural spring device 50' extends into an opening 15 of a movable electrode 10' laterally attached to seismic mass 3. Resiliently supported limit stop 61 is provided at the end of second flexural spring 50' and cooperates with projections 27 provided in opening 15. Apart from that, the function and design are identical with the first specific embodiment above.

Because of the design according to this further specific embodiment, no constraints given by the width of seismic mass 3 exist for the design of second flexural spring device 50'.

Although the present invention has been described above on the basis of a preferred exemplary embodiment, it is not limited thereto but can be modified in many ways.

In the above examples, the acceleration sensor according to the present invention has been explained in simple types for explaining its basic principles. Combinations of the examples and considerably more complicated embodiments are, of course, conceivable.

Although in the shown specific embodiment, the resiliently supported limit stops are provided only on two sides of the fixed limit stop, more complicated arrangements, for example, including resiliently supported limit stops on all sides of the fixed limit stop, are, of course, conceivable.

Moreover, the resiliently supported limit stops need not be joined to substrate 4 via the fixed limit stop but it is also possible to provide separate anchorings for that purpose. Also, the fixed limit stop can possibly be dropped completely.

It is also possible to use arbitrary micromechanical base materials and not just the silicon substrate specified as an example.

What is claimed is:

1. A micromechanical device comprising:
   a substrate;
   a seismic mass for deflecting in at least one direction by an acceleration;
   a first flexural spring device for resiliently supporting the seismic mass on the substrate;
   a stop device for limiting a deflection of the seismic mass, the stop device having at least one limit stop; and
   a second flexural spring device for resiliently supporting the at least one limit stop on the substrate,
   wherein the first flexural spring device has a first flexural strength, the second flexural spring device has a second flexural strength, and the second flexural strength is greater than the first flexural strength.

2. The micromechanical device according to claim 1, wherein the micromechanical device is an acceleration sensor.

3. The micromechanical device according to claim 1, wherein the stop device further includes at least one further limit stop fixedly supported on the substrate.

4. The micromechanical device according to claim 3, wherein the second flexural spring device joins the at least one limit stop to the at least one further limit stop.

5. The micromechanical device according to claim 1, wherein the stop device is situated in an opening of the seismic mass.

6. The micromechanical device according to claim 3, wherein the at least one limit stop enters into action in response to a first deflection magnitude, and the at least one further limit stop enters into action in response to a second deflection magnitude, the first deflection magnitude being smaller than the second deflection magnitude.

7. The micromechanical device according to claim 3, wherein the stop device has at least one projection on which a stopping effect is concentrated.

8. The micromechanical device according to claim 7, wherein a clearance of the at least one projection in a region of the at least one limit stop is smaller than in a region of the at least one further limit stop.

9. The micromechanical device according to claim 3, further comprising a movable electrode laterally attached to the seismic mass, wherein the at least one further limit stop is situated in an opening in the seismic mass, the second flexural spring device extending from the at least one further limit stop into an opening of the movable electrode, the at least one limit stop being situated substantially at an end of the second flexural spring device.

\* \* \* \* \*